(12) United States Patent
Tung

(10) Patent No.: US 12,255,541 B2
(45) Date of Patent: Mar. 18, 2025

(54) POWER TRANSISTOR CONVERSION DEVICE

(71) Applicant: Elmatek international Corp., San Jose, CA (US)

(72) Inventor: Steven Po-Cheng Tung, San Jose, CA (US)

(73) Assignee: ELMATEK INTERNATIONAL CORP., San Jose, CA (US)

( * ) Notice: Subject to any disclaimer, the term of this patent is extended or adjusted under 35 U.S.C. 154(b) by 277 days.

(21) Appl. No.: 17/751,135

(22) Filed: May 23, 2022

(65) Prior Publication Data

US 2023/0378884 A1 Nov. 23, 2023

(51) Int. Cl.
*H02M 7/00* (2006.01)
*H01L 23/40* (2006.01)
*H01L 23/31* (2006.01)

(52) U.S. Cl.
CPC ........ *H02M 7/003* (2013.01); *H01L 23/4006* (2013.01); *H01L 23/4093* (2013.01); *H01L 23/3107* (2013.01); *H01L 2023/4031* (2013.01); *H01L 2023/4043* (2013.01)

(58) Field of Classification Search
CPC ...... H05K 7/14; H05K 7/1401; H05K 7/1402; H05K 7/1405; H05K 7/1407; H05K 7/20; H05K 7/20163; H05K 2201/066; H05K 2201/10166; H05K 2201/10598; H02M 7/003
See application file for complete search history.

(56) References Cited

U.S. PATENT DOCUMENTS

| 4,285,003 A * | 8/1981 | Gaicki ................. H01L 23/492 |
| | | 257/E23.184 |
| 4,661,835 A * | 4/1987 | Gademann ........... H01L 23/055 |
| | | 228/123.1 |
| 2012/0069525 A1* | 3/2012 | Yang .................... H05K 7/2049 |
| | | 361/688 |
| 2016/0073549 A1* | 3/2016 | Liu ..................... H01L 23/4093 |
| | | 248/231.61 |

FOREIGN PATENT DOCUMENTS

| CN | 215011219 U * 12/2021 ............... H05K 7/20 |
| JP | S61104556 U * 7/1986 ............. H01L 23/40 |

* cited by examiner

*Primary Examiner* — Thienvu V Tran
*Assistant Examiner* — Shahzeb K Ahmad
(74) *Attorney, Agent, or Firm* — Chun-Ming Shih; HDLS IPR SERVICES

(57) ABSTRACT

A power transistor conversion device comprising: a base frame; and a fixing frame; wherein the base frame is provided with two limit holes within the base frame for fixing the base frame, and two through holes through which an input pin and an output pin of the power transistor pass through the base frame; the fixing frame is located perpendicular to an upper surface of the base frame, and the fixing frame is fastened to the base frame; the fixing frame is provided with a transistor limit unit for fixing the power transistor on the fixing frame. When applied, the transistor or the power transistor is fixed on the power transistor conversion device through the transistor limit unit, and then directly replaces the position of the power transistor to achieve better replaceability and better heat dissipation.

12 Claims, 6 Drawing Sheets

POWER TRANSISTOR CONVERSION DEVICE

BACKGROUND OF THE INVENTION

Field of the Invention

This present invention relates to the technical field of electronic components, especially a power transistor conversion device.

The Prior Arts

With the rapid development of science and technology of the advancement of the times, the types of electronic components not only have multiple functions, but also develop various sizes and shapes in response to different environments. Transistor or power transistor is a common electronic component, which is widely used in circuit design; its packaging styles are also quite diverse, and common plug-in packages comprises a dual in-line package (DIP), a Transistor Outline package (TO), a Pin Grid Array (PGA).

With the evolution of science and technology, transistors or power transistors in metal packages (such as TO-3, TO-66, etc.) are gradually replaced due to their large size and high cost, and even face the situation of shutdown and shortage of materials; Instead of, it is a transistor or a power transistor that uses a plastic package with a small volume and a relatively low cost (such as TO-220, TO-247, etc.); but it is still needed in some specific or old-style bodies and circuits. The need for transistors or power transistors of this larger size, metal package structure.

SUMMARY OF THE INVENTION

In view of this, the main purpose of this creation is to provide a power transistor conversion device, which comprises: a base frame and a fixing frame; wherein The base frame is provided with two limit holes of the base frame for fixing the base frame, and two through holes through which an input pin and an output pin of the power transistor pass through the base frame;

The fixing frame is located perpendicular to an upper surface of the base frame, and the fixing frame is fastened to the base frame; the fixing frame is provided with a transistor limit unit for fixing the power transistor on the fixing frame.

In a preferred embodiment, wherein the transistor limiting unit further comprises at least one transistor limit hole disposed on the fixing frame; and a fastener is attached through the transistor limit hole.

In a preferred embodiment, wherein the fastener is a bolt and a nut.

In a preferred embodiment, wherein the fastener further comprises an elastic piece that is locked and fixed on the transistor limit hole.

In a preferred embodiment, wherein the transistor limit unit further comprises: an elastic piece clamped and fixed to the fixing frame.

In a preferred embodiment, wherein one end of the elastic piece holding the power transistor is a wavy shape.

In a preferred embodiment, wherein both the base frame and the fixing frame are integrally formed as one-piece. But, actually, is not limited to foregoing.

During application, the power transistor is fixed on the power transistor conversion device (that is, on the fixing frame) through the transistor limit unit, and then the power transistor conversion device replaces the original power transistor in the position of an equipment or a circuit; thus achieving a better alternative solution and better heat dissipation through the increased area of the power transistor conversion device.

EMBODIMENT

Figure 1:
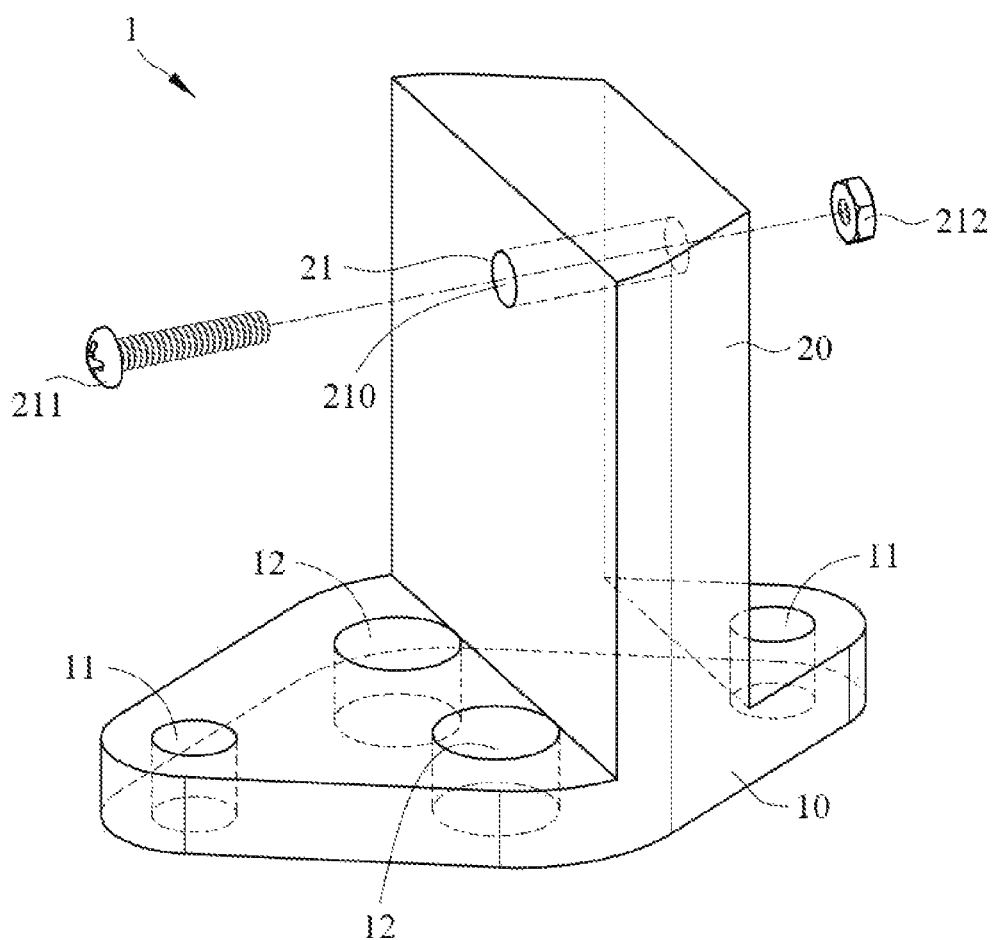
FIG. 1. The structure diagram of the present creation from the front side view.

In order to facilitate the understanding of the content of the present creation and the effects that can be achieved, the specific embodiments are listed herewith in conjunction with the drawings, and the detailed description is as follows: Please refer to FIGS. 1 to 6. In the present creation, the power transistor conversion device 1 comprises: a base frame 10 and a fixing frame 20; wherein The base frame 10 is provided with two limit holes 11 of the base frame 10 for fixing the base frame 10, and two through holes 12 through which an input pin and an output pin of the power transistor 30 pass through the base frame 10. The base frame 10 through the limit hole 11 of the base frame 10 by way of a bolt 211 and a nut 212, then fixed on the designated equipment or a circuit.

The fixing frame 20 is located perpendicular to an upper surface of the base frame 10, and the fixing frame 20 is fastened to the base frame 10; the fixing frame 20 is provided with a transistor limit unit 21 for fixing the power transistor 30 on the fixing frame 20.

The size specification of the bottom surface of the base frame 10 is adjusted according to the actual use requirements, for example, it is specifically the same as the size specification of the bottom surface of the power transistors of the existing metal packages (Metal Packages) such as TO-3, TO-66, etc., and, in addition to, the base frame 10 has two limit holes of the base frame 11 to the designated equipment or a circuit through a bolt and a nut, furthermore, there are two through holes 12. The function of the two through holes 12 is to allow the input pin and the output pin of the power transistor 30 to pass through the base frame 10 electrically, so that the power transistor 30 can be used on the designated equipment or circuit; in practical applications, if the power transistor 30 with short pins is encountered, can also be used wires by connecting the input pin and the output pin respectively and passing through the corresponding through holes 12 respectively. In this way, the power transistor 30 with the same characteristics but in different packages can directly replace the position of the original power transistor through the power transistor conversion device 1, and the heat dissipation area of the power transistor 30 is enlarged through the power transistor conversion device 1, which provide better cooling effect.

Figure 2:
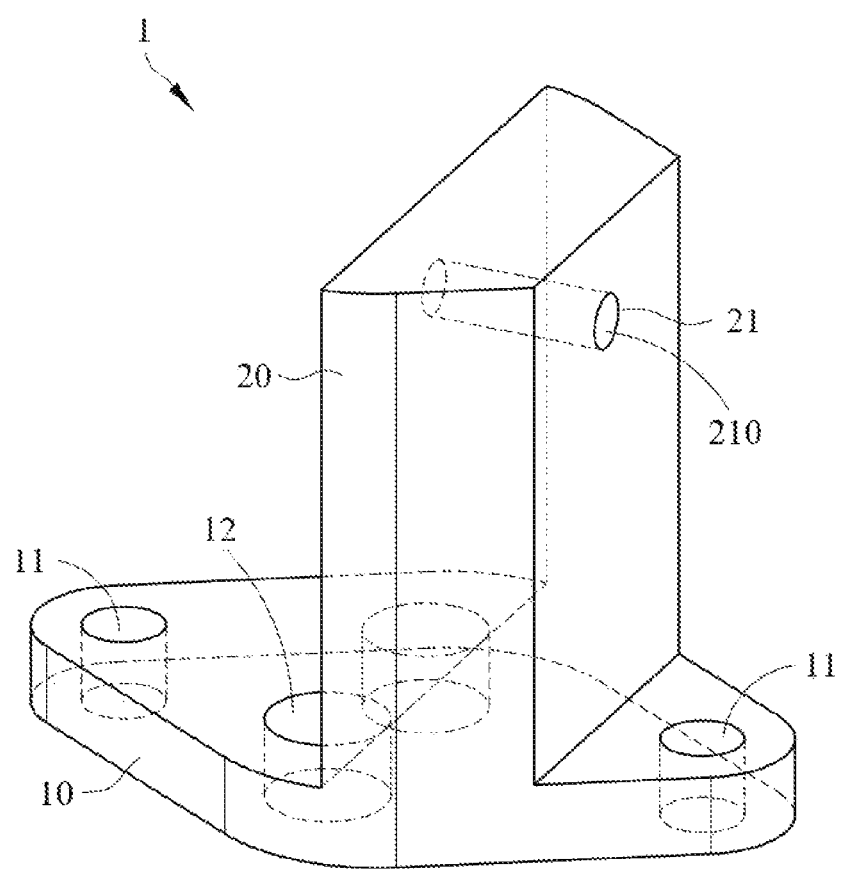
FIG. 2. A structure diagram of the present creation from the rear side view.
Figure 3:
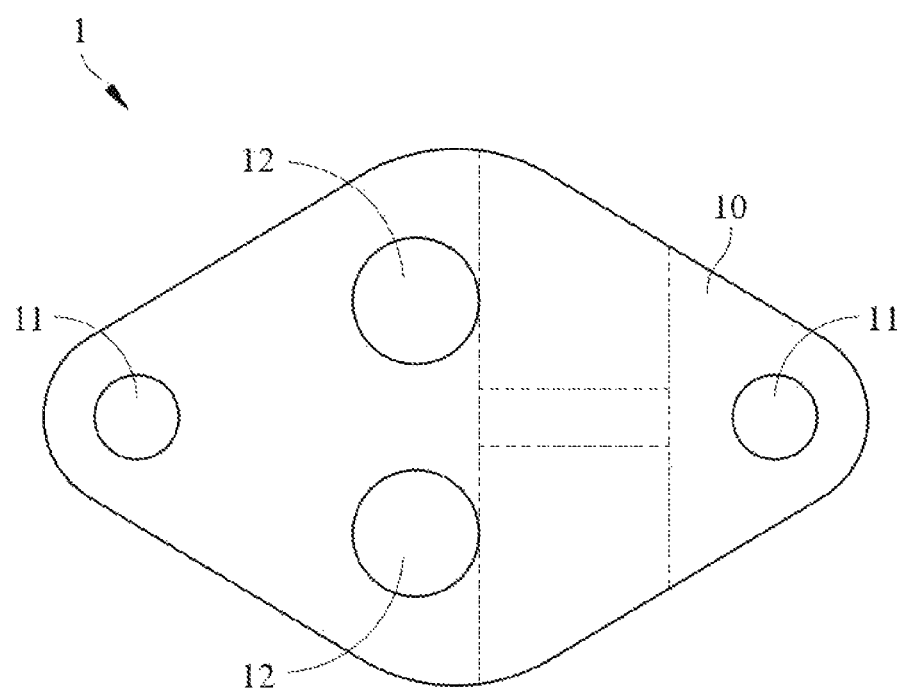
FIG. 3. Bottom view of the present creation.
Figure 4:
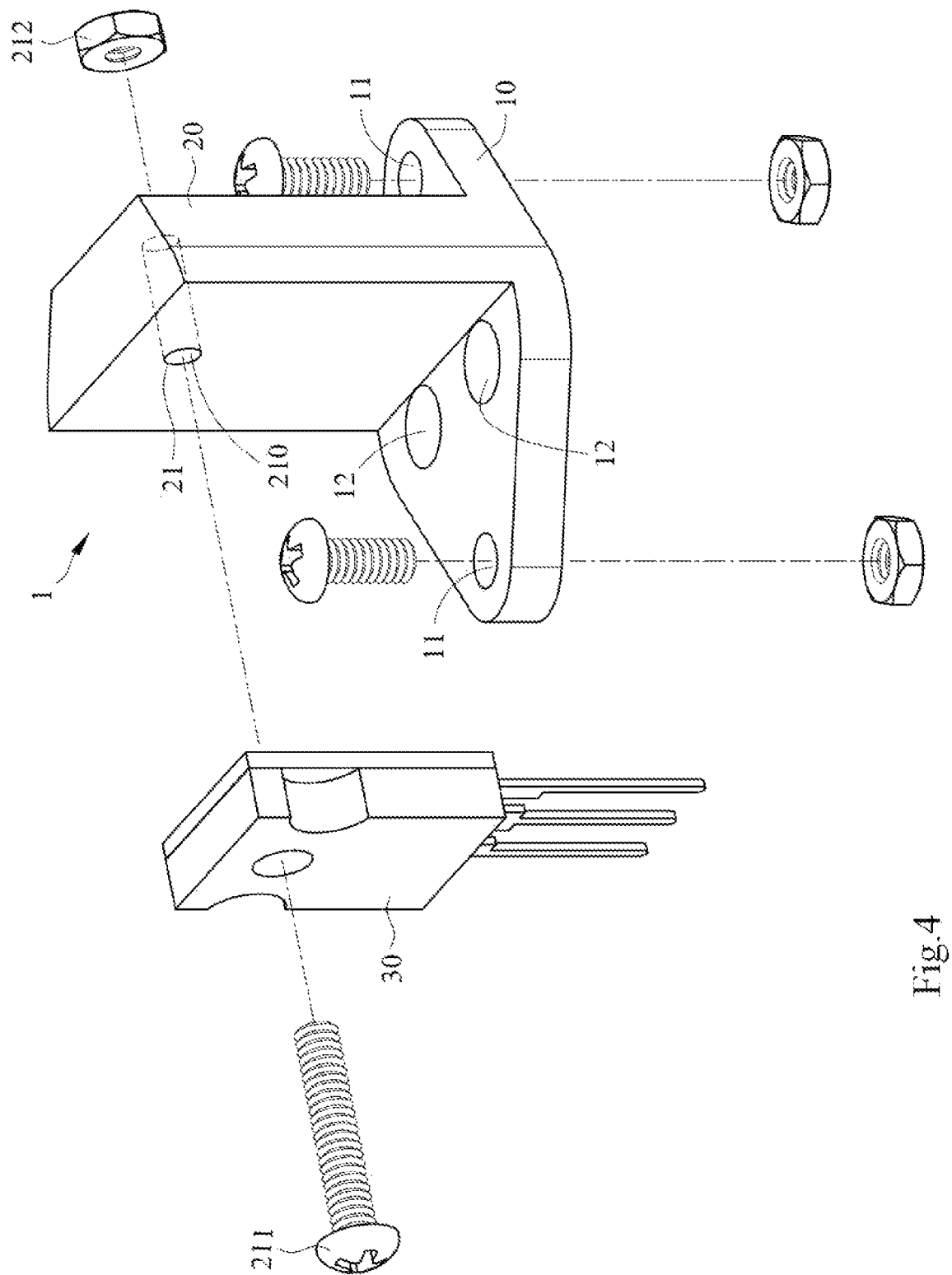
FIG. 4. A combination schematic diagram of the present creation and power transistors.

In a preferred embodiment, as shown in FIG. 1, FIG. 2 and FIG. 4, the transistor limit unit 21 further comprises at least one transistor limit hole 210 disposed on the fixing frame 20; and the fastener, wherein the transistor limit hole 210 is matched with the fastener. In practical application, the transistor limiting hole 210 can be increased into multiple numbers according to requirements. According to requirements, a plurality of components are fixed on the fixing frame 20 through fasteners and the transistor limiting hole 210 to form a small circuit. The input end and the output end of the circuit are led out through the two through holes 12; the fastener is also adjusted according to the needs of fixing different objects, such as clamping and fixing through a wire, a bolt with a nut or an elastic piece.

In a preferred embodiment, as shown in FIG. 1 and FIG. 4, the fasteners are a bolt 211 and a nut 212. The power transistor 30 of some plastic packages (eg. TO-220, TO-247) has a heat sink fixing hole on its structure for locking and fixing the heat sink; the heat sink fixing hole of the power transistor 30 and the transistor limit hole 210 are passed through the bolt 211, then locked and fixed by the nut 212. The existing package structure is used for fixing, which is not only convenient but also provides better heat dissipation for the power transistor 30.

Figure 5:
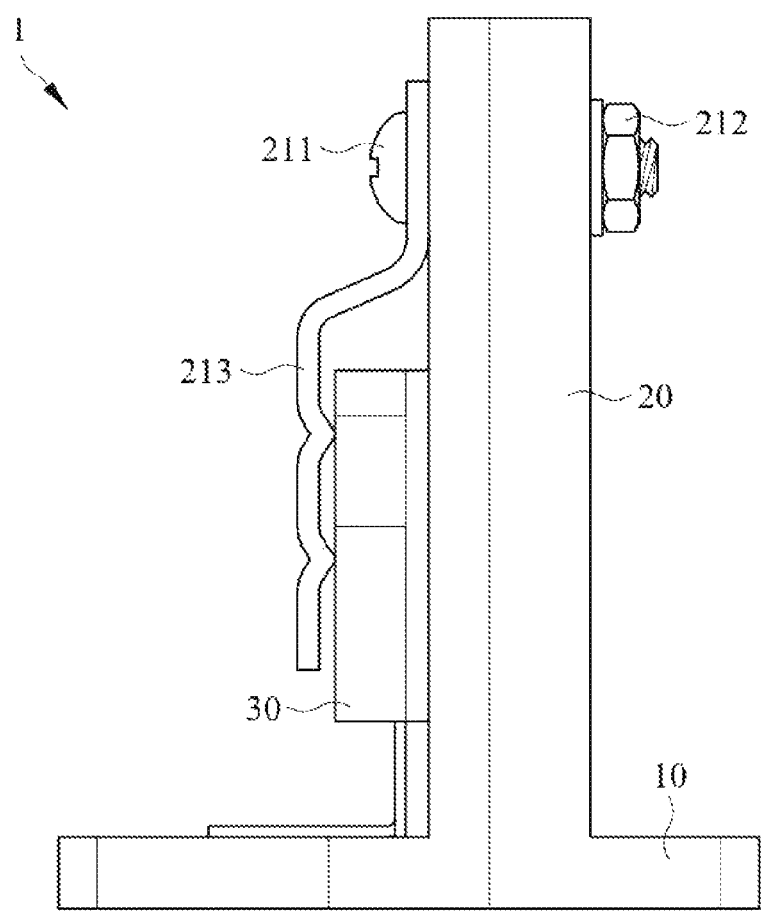
FIG. 5. A combination schematic diagram of fixing power transistors through an elastic piece in the present creation.

In a preferred embodiment, as shown in FIG. 5, the fastener further comprises an elastic piece 213 that is locked and fixed on the transistor limit hole 210. One end of the elastic piece 213 is locked on the transistor limiting hole 210 through the bolt 211 and the nut 212, and the other end of the elastic piece 213 can easily fix the power transistor 30 without the heat sink fixing hole to the power transistor conversion device 1.

Figure 6:
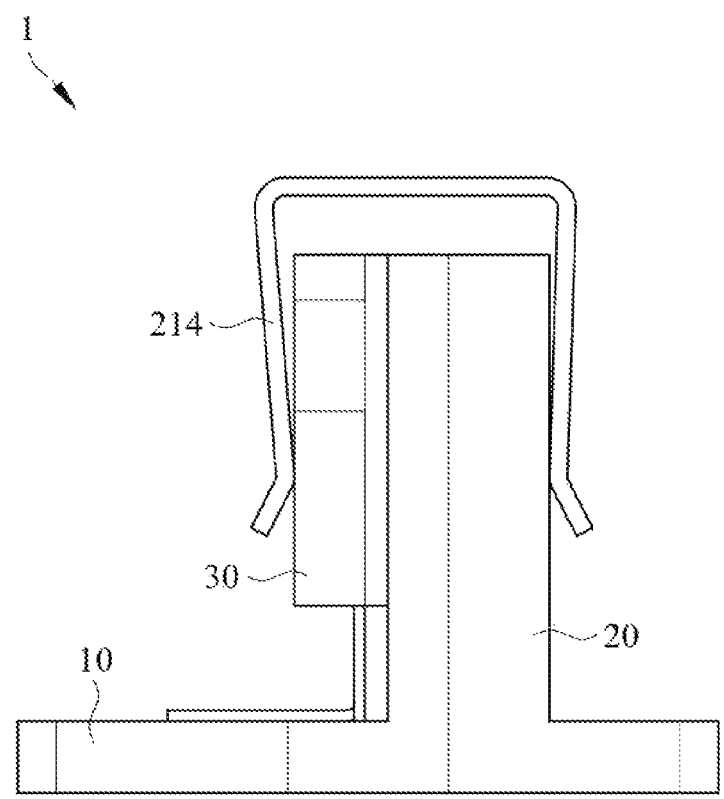
FIG. 6. A combination schematic diagram of the fixed power transistor clamped and fixed to an elastic piece in the present creation.

In a preferred embodiment, as shown in FIG. 6, the transistor limiting unit 21 further comprises an elastic piece 214 clamped and fixed to the fixing frame 20. For the power transistor 30 without the fixing hole for the heat sink, the elastic piece 214 can also be used for simple clamping and fixing.

In a preferred embodiment, as shown in FIG. 5 and FIG. 6, one end of the elastic piece holding the power transistor 30 is a wavy shape. Both the elastic piece 213 in FIG. 5 and the elastic piece 214 in FIG. 6 are wavy shape which are clamped at one end of the power transistor 30, and the power transistor 30 is provided with a more concentrated clamping force and is more stable through the wavy convex portion.

In a preferred embodiment, as shown in FIG. 1 to FIG. 6, wherein both the base frame and the fixing frame are integrally formed as one-piece. The integrally formed structure saves time and cuts cost in production.

Compared with the prior art, the present invention creates a power transistor conversion device 1, which can provide an effective alternative to an equipment and circuit of a power transistor, for the existing use of metal packaging, such as TO-3, TO-66 type power transistors, etc.; the existing common plastic packaged of the power transistor 30 is fixed on the power transistor conversion device 1 through the applicable transistor limit unit 21, and the input pin and output pin of the power transistor 30 pass through two through holes 12 which pass through the base frame 10, and if there are other non-input pins and non-output pins, which can be directly bent on the base frame 10, as shown in FIG. 5 and FIG. 6; and then directly replace the position of the original power transistor; What's more, when encountering special circuit requirements, the improved circuit can also be fixed on the power transistor conversion device 1, and the input end and output end of the circuit can be led out from the two through holes 12 respectively; It not only achieves higher component replaceability and applicability, but also avoids the risk of material shortage or even shutdown of specific power transistors, and also has better heat dissipation performance and meets the needs of special customized circuit structures.

To sum up, the present creation is novel and practical and fully meets the requirements of the patent, and the present patent application is submitted. However, the above are only the preferred embodiments of the present creation, and should not limit the scope of the implementation of the present creation; therefore, any equivalent changes and modifications made in accordance with the scope of the present patent application for the present creation and the content of the present creation description should be covered by the present creative patent.

What is claimed is:

1. A power transistor conversion device comprising:
   a base frame with a bottom being a diamond shape, wherein the bottom of the base frame has the same shape as a bottom of a TO-3 package, so as to replace the TO-3 package by the base frame of the power transistor conversion device; and
   a fixing frame;
   wherein the base frame is provided with two limit holes within the base frame for fixing the base frame, and two through holes through which an input pin and an output pin of the power transistor pass through the base frame;
   the fixing frame is located perpendicular to an upper surface of the base frame, and the fixing frame is fastened to the base frame;
   the fixing frame is provided with a transistor limit unit for fixing a power transistor on the fixing frame.

2. The power transistor conversion device as claimed in claim 1,
   wherein the transistor limiting unit further comprises:
   at least one transistor limit hole disposed on the fixing frame; and
   a fastener attached through the transistor limit hole.

3. The power transistor conversion device as claimed in claim 2, wherein the fastener is a bolt and a nut.

4. The power transistor conversion device as claimed in claim 3,
   wherein both the base frame and the fixing frame are integrally formed as one-piece.

5. The power transistor conversion device as claimed in claim 2, wherein the fastener further comprises an elastic piece that is locked and fixed on the transistor limit hole.

6. The power transistor conversion device as claimed in claim 5,
   wherein one end of the elastic piece holding the power transistor is a wavy shape.

7. The power transistor conversion device as claimed in claim 5,
   wherein both the base frame and the fixing frame are integrally formed as one-piece.

8. The power transistor conversion device as claimed in claim 2,
   wherein both the base frame and the fixing frame are integrally formed as one-piece.

9. The power transistor conversion device as claimed in claim 1, wherein the transistor limit unit further comprises:
   an elastic piece clamped and fixed to the fixing frame.

10. The power transistor conversion device as claimed in claim 9,
    wherein one end of the elastic piece holding the power transistor is a wavy shape.

11. The power transistor conversion device as claimed in claim 9, wherein both the base frame and the fixing frame are integrally formed as one-piece.

12. The power transistor conversion device as claimed in claim 1,
wherein both the base frame and the fixing frame are integrally formed as one-piece.

* * * * *